US007574313B2

(12) United States Patent
Disch et al.

(10) Patent No.: US 7,574,313 B2

(45) **Date of Patent: *Aug. 11, 2009**

(54) INFORMATION SIGNAL PROCESSING BY MODIFICATION IN THE SPECTRAL/MODULATION SPECTRAL RANGE REPRESENTATION

(75) Inventors: Sascha Disch, Fuerth (DE); Karsten Linzmeier, Erlangen (DE); Juergen Herre, Bucknhof (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 23 days.

This patent is subject to a terminal disclaimer.

(21) Appl. No.: 11/553,376

(22) Filed: Oct. 26, 2006

(65) Prior Publication Data

US 2007/0100610 A1 May 3, 2007

Related U.S. Application Data

(63) Continuation of application No. PCT/EP2005/003064, filed on Mar. 22, 2005.

(30) Foreign Application Priority Data

Apr. 30, 2004 (DE) ....................... 10 2004 021 403

(51) Int. Cl.
*G01R 23/16* (2006.01)
*G06F 17/14* (2006.01)

(52) U.S. Cl. ............................ 702/77; 702/66; 702/75; 702/76; 702/189; 708/404; 708/405

(58) Field of Classification Search ................... 702/57, 702/66, 75–78, 106, 189; 708/400, 403–405
See application file for complete search history.

(56) References Cited

U.S. PATENT DOCUMENTS 5,173,923 A * 12/1992 Crespo et al. ............... 375/343
5,321,497 A 6/1994 Ai et al.
5,671,168 A * 9/1997 Liu et al. .................... 708/321

(Continued)

FOREIGN PATENT DOCUMENTS

DE 19640814 9/1997

(Continued)

OTHER PUBLICATIONS

L. Atlas et al. "Joint Acoustic and Modulation Frequency," EURASIP Journal on Applied Signal Processing, 2003, vol. 7, pp. 668-675.

(Continued)

*Primary Examiner*—Eliseo Ramos Feliciano
*Assistant Examiner*—Mi'schita' Henson
(74) *Attorney, Agent, or Firm*—Michael A. Glenn; Glenn Patent Group

(57) ABSTRACT

Processing of information signals separated according to modulation and carrier components in a more controlled way is made possible by a device for processing an information signal including a unit for converting the information signal to a time/spectral representation by block-wise transforming of the information signal and a unit for converting the information signal from the time/spectral representation to a spectral/modulation spectral representation, wherein the unit for converting is designed such that the spectral/modulation spectral representation depends on both a magnitude component and a phase component of the time/spectral representation of the information signal. A unit then performs a manipulation and/or modification of the information signal in the spectral/modulation spectral representation to obtain a modified spectral/modulation spectral representation. A further unit finally forms a processed information signal representing a processed version of the information signal based on the modified spectral/modulation spectral representation.

19 Claims, 2 Drawing Sheets

U.S. PATENT DOCUMENTS

| | | | | |
|---|---|---|---|---|
| 5,724,270 | A * | 3/1998 | Posch | 702/77 |
| 6,584,138 | B1 * | 6/2003 | Neubauer et al. | 375/130 |
| 6,725,372 | B1 | 4/2004 | Lewis et al. | |
| 7,254,500 | B2 * | 8/2007 | Makeig et al. | 702/75 |
| 2002/0006203 | A1 | 1/2002 | Tachibana et al. | |
| 2002/0168082 | A1 | 11/2002 | Razdan | |
| 2002/0176353 | A1 | 11/2002 | Atlas et al. | |
| 2002/0176365 | A1 | 11/2002 | Lund | |
| 2003/0093282 | A1 * | 5/2003 | Goodwin | 704/500 |
| 2003/0185411 | A1 | 10/2003 | Atlas et al. | |
| 2004/0024588 | A1 | 2/2004 | Watson et al. | |
| 2004/0184369 | A1 | 9/2004 | Herre | |

FOREIGN PATENT DOCUMENTS

| | | |
|---|---|---|
| DE | 19947877 | 10/2001 |
| DE | 10129239 | 10/2002 |
| EP | 0840513 A2 | 5/1998 |
| WO | WO9733391 | 9/1997 |
| WO | WO 01/54053 | 7/2001 |
| WO | WO0396337 | 11/2003 |

OTHER PUBLICATIONS

M. Celik et al., "Collusion-Resilient Fingerprinting Using Random Pre-Warping", Image Processing, Proceedings in 2003 International Conference on Sep. 14-17, 2003, vol. 1, pp. I-509 to I-512, vol. 1.

C. NeuBauer et al., "A Compatible Family of Bitstream Watermarking Schemes for MPEG-Audio," Proceedings in the AES 110$^{th}$ Convention, May 12-15, 2001, Amsterdam, The Netherlands, pp. 1-12.

C. NeuBauer et al., "Audio Watermarking of MPEG-2 AAC Bit Streams," Presented at the AES 108$^{th}$ Convention, Feb. 19-22, 2000, Paris, France, pp. 1-19.

F. Siebenhaar et al., "Combined Compression/Watermarking for Audio Signals," AES Convention Paper 5344, Presented at the AES 110$^{th}$ Convention, May 12-15, 2001, Amsterdam, The Netherlands, pp. 1-10.

T. Houtgast, "Frequency Selectivity in Amplitude-Modulation Detection," J. Acoust. Soc Am. 85 (4), Apr. 1989, pp. 1676-1680.

M. van der Veen et al., "Robust, Multi-Functional and High-Quality Audio Watermarking Technology," AES Convention Paper 5345, Presented at the AES 110$^{th}$ Convention, May 12-15, 2001, Amsterdam, The Netherlands, pp. 1-9.

M. Vinton et al., "A Scalable and Progressive Audio Codec," Appeared in IEEE ICASSP, May 7-11, 2001, Salt Lake City, Utah, pp. 1-4.

J. Thompson et al., "A Non-Uniform Modulation Transform for Audio Coding with Increased Time Resolution," Proceedings of the 2003 IEEE ICASSP, vol. 5, pp. 397-400, 2003.

C. Neubauer et al., "Digital Watermarking and its Influence on Audio Quality," Preprint No. 4823, Presented at AES 105$^{th}$ Convention, Aug. 1998, pp. 9798-9809.

J. Haitsma et al., "Audio Watermarking for Monitoring and Copy Protection," International Multimedia Conference Archive, Proceedings of the 2000 ACM Workshops on Multimedia, Los Angeles, CA, pp. 119-122, 2000.

J. Dittmann, "Combining Digital Watermarks and Collusion Secure Fingerprints for Customer Copy Monitoring," Journal of Electronic Imaging, Oct. 2000, vol. 9, Issue 4, pp. 456-467.

C. Neubauer et al., "Advanced Watermarking and its Applications," Presented at the 109$^{th}$ Convention, Sep. 22-25, 2000, Los Angeles, CA, pp. 1-19.

English Translation of the Korean Office Action for parallel application, Document No. 9-5-2009-021647588, dated May 22, 2009.

* cited by examiner

INFORMATION SIGNAL PROCESSING BY MODIFICATION IN THE SPECTRAL/MODULATION SPECTRAL RANGE REPRESENTATION

CROSS-REFERENCE TO RELATED APPLICATION

This application is a continuation of copending International Application No. PCT/EP2005/003064, filed on Mar. 22, 2005, which designated the United States and was not published in English.

BACKGROUND OF THE INVENTION

1. Field of the Invention

The present invention generally relates to the processing of information signals, such as audio signals, video signals or other multimedia signals, and particularly to the processing of information signals in the spectral/modulation spectral range.

2. Description of the Related Art

In the field of signal processing, such as the processing of digital audio signals, there are frequently signals consisting of a carrier signal component and a modulation component. In the case of modulated signals, a representation in which the signals are decomposed into carrier and modulation components is often required, for example to be able to filter, code or otherwise modify them.

For the purposes of audio coding, it is known, for example, to subject the audio signal to a so-called modulation transform. Here, the audio signal is decomposed into frequency bands by a transform. Subsequently, a decomposition into magnitude and phase is performed. While the phase is not processed any further, the magnitudes per subband are re-transformed via a number of transform blocks in a second transform. The result is a frequency decomposition of the time envelope of the respective subband into modulation coefficients. Audio codings consisting of such a modulation transform are, for example, described in M. Vinton and L. Atlas, "A Scalable and Progressive Audio Codec", in Proceedings of the 2001 IEEE ICASSP, 7-11 May 2001, Salt Lake City, United States Patent Application US 2002/0176353A1: Atlas et al., "Scalable And Perceptually Ranked Signal Coding And Decoding", Nov. 28, 2002, and J. Thompson and L. Atlas, "A Non-uniform Modulation Transform for Audio Coding with Increased Time Resolution", in proceedings of the 2003 IEEE ICASSP, 6-10 April, Hong Kong, 2003.

An overview of further various demodulation techniques across the full bandwidth of the signal to be demodulated including asynchronous and synchronous demodulation techniques, etc. is given, for example, by the article L. Atlas, "Joint Acoustic And Modulation Frequency", Journal on Applied Signal Processing 7 EURASIP, pp. 668-675, 2003.

A disadvantage of the above schemes for audio coding using a modulation transform is the following. As long as no further processing steps are performed on the modulation coefficients together with the phases, the modulation coefficients form a spectral/modulation spectral representation of the audio signal that is reversible and perfectly reconstructing, i.e. it is re-convertible without changes back into the original audio signal in the time domain. However, in these methods the modulation coefficients are filtered to reduce and/or quantize the modulation coefficients to values as small as possible according to psychoacoustic criteria, so that a maximum compression rate is achieved. However, this generally does not accomplish the desired goal to remove the respective modulation components from the resulting signal or to deliberately introduce quantization noise in this component. This is due to the fact that, after the back-transform of the changed modulation coefficients, the phases of the subbands are no longer consistent with the changed magnitudes of these subbands and continue to contain strong components of the modulation component of the original signal. If the phases of the subbands are now recombined with the changed magnitudes, these modulation components are reintroduced into the filtered or quantized signal by the phase. In other words, a modulation transform followed by a modification of the modulation coefficients in the above manner, i.e. by filtering the modulation coefficients, together with a subsequent synthesis of the phase and magnitude components provides a signal that, in another analysis and/or modulation transform, still contains significant modulation components at those places in the spectral/modulation spectral range representation that should have been filtered out. Effective filtering is thus not possible based on the above-mentioned modulation transform-based signal processing schemes.

Therefore, there is a need for an information signal processing scheme allowing to process modulated signals with a carrier component and a modulation component separated according to modulation and carrier component in a more controlled way.

SUMMARY OF THE INVENTION

It is the object of the present invention to provide a processing scheme for information signals allowing processing of information signals that is separated according to modulation and carrier components in a more controlled way.

In accordance with a first aspect, the present invention provides a device for processing an information signal, having a unit for converting the information signal to a time/spectral representation by block-wise transforming of the information signal; a unit for converting the information signal from the time/spectral representation to a spectral/modulation spectral representation by means of a single frequency decomposition transform, wherein the unit for converting is designed such that the spectral/modulation spectral representation depends on both a magnitude component and a phase component of the time/spectral representation of the information signal; a unit for manipulating the information signal in the spectral/modulation spectral representation to obtain a modified spectral/modulation spectral representation; and a unit for forming a processed information signal representing a processed version of the information signal based on the modified spectral/modulation spectral representation.

In accordance with a second aspect, the present invention provides a method for processing an information signal, having the steps of converting the information signal to a time/spectral representation by block-wise transforming of the information signal; converting the information signal from the time/spectral representation to a spectral/modulation spectral representation by means of a single frequency decomposition transform, wherein the conversion is performed such that the spectral/modulation spectral representation depends on both a magnitude component and a phase component of the time/spectral representation of the information signal; modifying the information signal in the spectral/modulation spectral representation to obtain a modified spectral/modulation spectral representation; and forming a processed information signal representing a processed version of the information signal based on the modified spectral/modulation spectral representation.

In accordance with a third aspect, the present invention provides a computer program with a program code for per forming the above-mentioned method when the computer program runs on a computer.

An inventive device for processing an information signal includes means for converting the information signal into a time/spectral representation by block-wise transforming the information signal and means for converting the information signal from the time/spectral representation to a spectral/modulation spectral representation, wherein the means for converting is designed such that the spectral/modulation spectral representation depends on both a magnitude component and a phase component of the time/spectral representation of the information signal. A means then performs a manipulation and/or modification of the information signal in the spectral/modulation spectral representation to obtain a modified spectral/modulation spectral representation. A further means finally forms a processed information signal representing a processed version of the information signal based on the modified spectral/modulation spectral representation.

The core idea of the present invention is that processing of information signals that is separated more rigorously according to modulation and carrier components may be achieved if the conversion of the information signal from the time/spectral representation and/or the time/frequency representation into the spectral/modulation spectral representation and/or the frequency/modulation frequency representation is performed depending on both a magnitude component and a phase component of the time/spectral representation of the information signal. This eliminates a recombination between phase and magnitude and thus the reintroduction of undesired modulation components into the time representation of the processed information signal on the synthesis side.

The conversion of the information signal from the time/spectral representation to the spectral/modulation spectral representation considering both the magnitude and the phase involves the problem that the time/spectral representation of the information signal actually depends not only on the information signal, but also on the phase offset of the time blocks with respect to the carrier spectral component of the information signal. In other words, the block-wise transform of the information signal from the time representation to the time/spectral representation causes the sequences of spectral values obtained in the time/spectral representation of the information signal per spectral component to comprise an up-modulated complex carrier depending only on the asynchronism of the block repeating frequency with respect to the carrier frequency component of the information signal. According to the embodiments of the present invention, a demodulation of the sequence of spectral values in the time/spectral representation of the information signal is thus performed per spectral component to obtain a demodulated sequency of spectral values per spectral component. The subsequent conversion of the thus obtained demodulated sequences of spectral values is performed by block-wise transform of the time/spectral representation into the spectral/modulation spectral representation and/or by their block-wise spectral decomposition, thereby obtaining blocks of modulation values. These are manipulated and/or modified, for example weighted with a corresponding weighting function for bandpass filtering for the removal of the modulation component from the original information signal. The result is a modified demodulated sequence of spectral values and/or a modified demodulated time/spectral representation. The complex carrier is again modulated upon the thus obtained modified demodulated sequences of spectral values, thus obtaining a modified sequence of spectral values representing a part of a time/spectral representation of the processed information signal. A back-conversion of this representation into the time representation yields a processed information signal in the time representation and/or time domain, which may be changed in a highly accurate way with respect to the original information signal regarding modulation and carrier components.

BRIEF DESCRIPTION OF THE DRAWINGS

Preferred embodiments of the present invention will be explained below in more detail referring to the accompanying drawings, in which.

DESCRIPTION OF THE PREFERRED EMBODIMENTS

Figure 1:
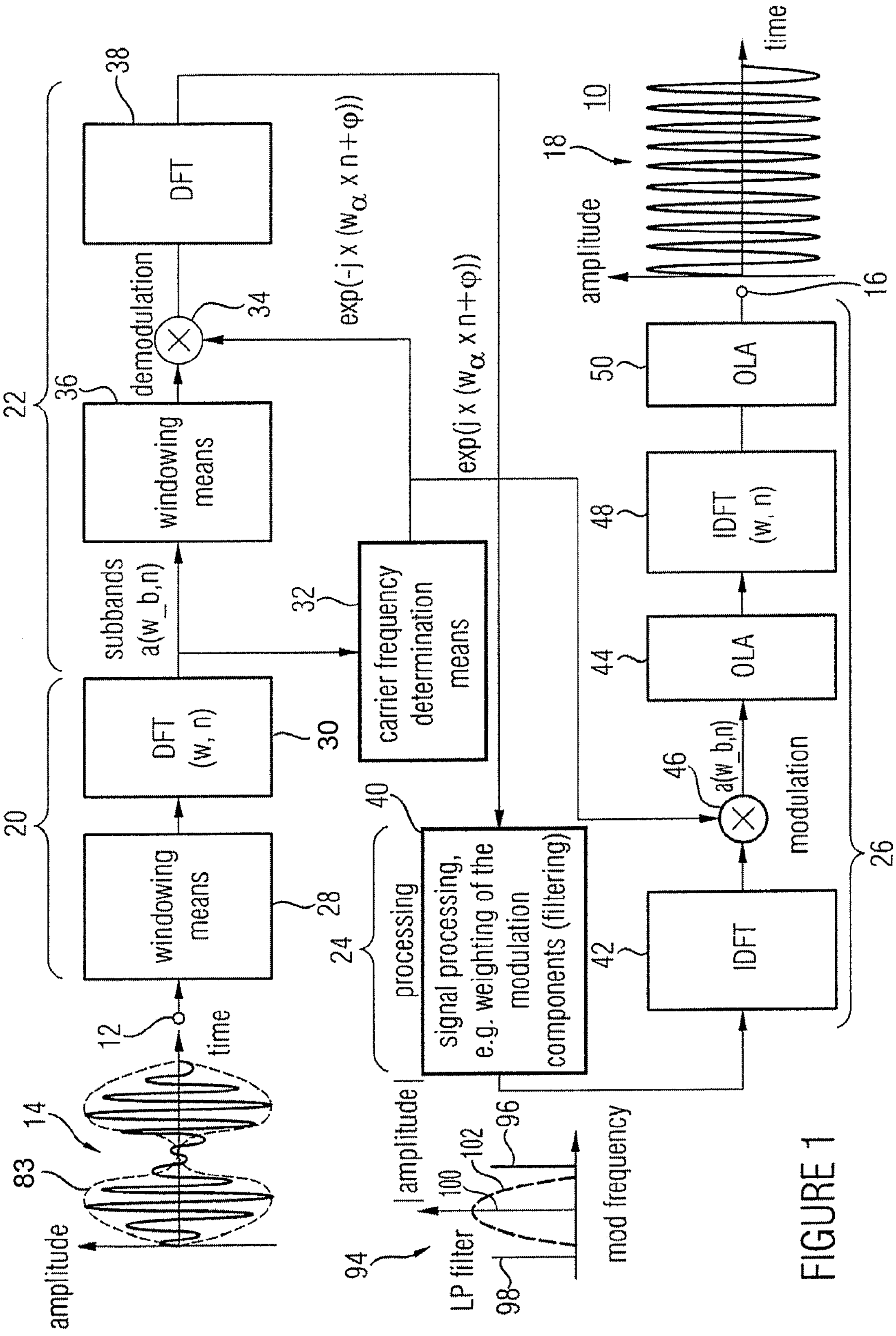
FIG. 1 shows a block circuit diagram of a device for processing an information signal according to an embodiment of the present invention.

FIG. 1 shows a device for processing an information signal according to an embodiment of the present invention. The device of FIG. 1, generally indicated at 10, includes an input 12, at which it receives the information signal 14 to be processed. The device of FIG. 1 is exemplarily provided to process the information signal 14 such that the modulation component is removed from the information signal 14, and to thus obtain a processed information signal with only the carrier component. Furthermore, the device 10 includes an output 16 to output the carrier component as the processing result and/or the processed information signal 18.

Internally, the device 10 is essentially divided into a portion 20 for converting the information signal 14 from a time representation to a time/frequency representation, means 22 for converting the information signal from the time/frequency representation to the frequency/modulation frequency representation, a portion 24 in which the actual processing is performed, i.e. the modification of the information signal, and a portion 26 for the back-conversion of the information signal processed in the frequency/modulation frequency representation from this representation to the time representation. The mentioned four portions are connected in series between the input 12 and the output 16 in this order, wherein their more detailed structure and their more detailed operation will be described below.

Portion 20 of the device 10 includes a windowing means 28 and a transform means 30 that follow at the input 12 in this order. In particular, an input of the windowing means 28 is connected to input 12 to receive the information signal 14 as a sequence of information values. If the information signal is still present as an analog signal, it may, for example, be converted to a sequence of information and/or sample values by an A/D converter and/or discrete sampling. The windowing means 28 forms blocks of the same number of information values each from the sequence of information values and additionally performs a weighting with a weighting function on each block of information values which, however, cannot, for example, exclusively correspond to a sine window or a KBD window. The blocks may overlap, such as by 50%, or not. Merely as an example, a 50% overlap is assumed in the following. The preferred window functions have the property that they allow good subband separation in the time/spectral representation and that the squares of their weighting values, which correspond to each other as they are applied to one and the same information value, and to one in the overlap area.

An output of the windowing means 28 is connected to an input of the transform means 30. The blocks of information values output by the windowing means 28 are received by the transform means 30. The transform means 30 then subjects them block-wise to a spectrally decomposing transform, such as a DFT or another complex transform. The transform means 30 thus block-wise achieves a decomposition of the information signal 14 into spectral components and thus particularly generates a block of spectral values including one spectral value per spectral component per time block, as it is received from the windowing means 28. Several spectral values may be combined to subbands. In the following, however, the terms subband and spectral component are used as synonyms. For each spectral component and/or each subband, the result is thus one spectral value or several ones, if there is a subband combination, which, however, is not assumed in the following, per time block. Accordingly, the transform means 30 outputs a sequence of spectral values per spectral component and/or subband that represent the course in time of this spectral component and/or this subband. The spectral values output by the transform means 30 represent a time/frequency representation of the information signal 14.

Portion 22 includes a carrier frequency determination means 32, a mixer 34 serving as demodulation means, a windowing means 36 and a second transform means 38.

The windowing means 32 includes an input connected to the output of the transform means 30. There it receives the spectral value sequences for the individual subbands and divides the spectral value sequences per subband—similarly to the windowing means 28 with respect to the information signal 14—into blocks and weights the spectral values of each block with an appropriate weighting function. The weighting function may be one of the weighting functions already exemplarily mentioned above with respect to means 28. The consecutive blocks in a subband may or may not overlap, wherein the following again exemplarily assumes a mutual overlap of 50%. The following assumes that the blocks of different subbands are aligned with respect to each other, as it will be explained in more detail below with respect to FIG. 1. However, another procedure with block sequences offset between the subbands would also be conceivable. At the output, the windowing means outputs sequences of windowed spectral value blocks per subband.

The carrier frequency determination means 32 also includes an input connected to the output of the transform means 30 to obtain the spectral values of the subbands and/or spectral components as sequences of spectral values per subband. It is provided to find out, in each subband, the carrier component caused by the individual time blocks, from which the individual spectral values of the subbands have been derived, comprising a phase offset varying in time with respect to the carrier frequency component of the information signal 14. The carrier frequency determination means 32 outputs the carrier component determined per subband at its output to an input of the mixer 34 which, in turn, has another input connected to the output of the windowing means 36.

The mixer 34 is designed such that it multiplies, per subband, the blocks of windowed spectral values, as they are output by the transform means, by the complex conjugate of the respective carrier component, as it has been determined by the carrier frequency determination means 30 for the respective subband, thus demodulating the subbands and/or blocks of windowed spectral values.

At the output of the mixer 34, the result are thus demodulated subbands and/or the result is a sequence of demodulated blocks of windowed spectral values per subband. The output of the mixer 34 is connected to an input of the transform means 38, so that the latter receives blocks of windowed and demodulated spectral values overlapping each other—here by exemplary 50%—per subband and transforms and/or spectrally decomposes them block-wise into the spectral/modulation spectral representation to generate a frequency/modulation frequency representation of the information signal 14 up to now only modified with respect to the demodulation of the subband spectral value sequences by processing all subbands and/or spectral components. The transform on which the transform means 38 is based per subband may be, for example, a DFT, an MDCT, MDST or the like, and particularly also the same transform as that of transform means 30. FIG. 1 exemplarily assumes that the transforms of both transform means 30, 38 is a DFT.

Accordingly, the transform means 38 successively outputs blocks of values, referred to as modulation values in the following and representing a spectral decomposition of the blocks of windowed and demodulated spectral values, at its output for each subband and/or each spectral component. The blocks of spectral values per subband, with respect to which the transform means 38 performs the transforms, are time-aligned with each other, so that the result per time period is always immediately a matrix of modulation values composed of a modulation value block per subband. The transform means 38 passes the modulation values on to the portion 24, which only comprises a signal processing means 40.

The signal processing means 40 is connected to the output of the transform means 38 and thus receives the blocks of modulation values, in the present exemplary case, because the device 10 serves for modulation component suppression, the signal processing means 40 performs an effective low-pass filtering in the frequency domain on the incoming blocks of modulation values, i.e. a weighting of the modulation values with a function dropping to higher and/or lower modulation frequencies starting from the modulation frequency zero. The thus modified blocks of modulation values are passed to the back-conversion portion 26 by the signal processing means 40. The modified blocks of modulation values output by the signal processing means 40 represent a modified frequency/modulation frequency representation of the information signal 14, or in other words a frequency/modulation frequency representation still differing from the frequency/modulation frequency representation of the modified information signal 18 by the demodulation by the mixer 34.

The back-conversion portion 26, in turn, is divided into two portions, i.e. a portion for the conversion of the processed information signal 18 from the frequency/modulation frequency representation, as output by the signal processing means 40, to the time/frequency representation, and a portion for the back-conversion of the processed information signal from the time/frequency representation to the time representation. The former of the two portions includes transform means 42 for performing a block-wise transform inverse to the transform according to the transform means 38, a mixer 46 and a combination means 44. The latter portion of the back-conversion portion 26 includes transform means 48 for performing a block-wise transform inverse to the transform of the transform means 30 and a combination means 50.

With the input, the inverse transform means 42 is connected to the output of the signal processing means 40 and transforms the modified blocks of modulation values subband-wise from the spectral representation back to the time/frequency representation and thus reverses the spectral decomposition to obtain a sequence of modified blocks of spectral values per subband. These modified spectral value blocks output by the inverse transform means 42 differ from the spectral value blocks as output by the windowing means 36, but not only by the processing by the signal processing means 40, but also by the demodulation effected by the mixer 34. Therefore, the mixer 46 receives the sequences of modified spectral value blocks output by the inverse transform means 42 per subband and mixes them with a complex carrier, which is complex conjugate with respect to that used at the corresponding place and/or for the corresponding block for the demodulation of the information signal at the mixer 34, to modulate the spectral value blocks again with the carrier caused by the phase offsets of the time blocks. The result yielded at the output of the mixer 46 is a sequence of modified, non-demodulated spectral value blocks per subband.

The output of the mixer 46 is connected to an input of the combination means 44. It combines, per subband, the sequence of modified blocks of spectral values again up-modulated with the complex carrier to form a uniform stream and/or a uniform sequence of spectral values by appropriately linking mutually corresponding spectral values of adjacent and/or consecutive blocks of spectral values for a subband, as they are received from the mixer 46. In the case of the use of weighting functions exemplarily mentioned above with the positive property that the squares of mutually corresponding weighting values are summed to one in the case of overlapping, the combination consists in a simple addition of spectral values associated with each other. The result output at the output of the combination means 44 (OLA=overlap add) is composed of a modified sequence of spectral values per subband. The result thus output at the output of the OLA 44 are thus modified subbands and/or modified sequences of spectral values for all spectral components and represents a modified time/frequency representation of the information signal 14 and/or a time/frequency representation of the modified information signal 18.

The transform means 48 receives the spectral value sequences and thus particularly one after the other always one spectral value for all subbands and/or spectral components and/or one after the other one spectral decomposition of a portion of the modified information signal 18. By reversing the spectral decomposition, it generates a sequence of modified time blocks from the sequence of spectral decompositions. These modified time blocks are, in turn, received by the combination means 50. The combination means 50 operates similarly to the combination means 44. It combines the modified time blocks exemplarily overlapping by 50% by adding mutually corresponding information values from adjacent and/or consecutive modified time blocks. The result at the output of the combination means 50 is thus a sequence of information values representing the processed information signal 18.

Figure 2:
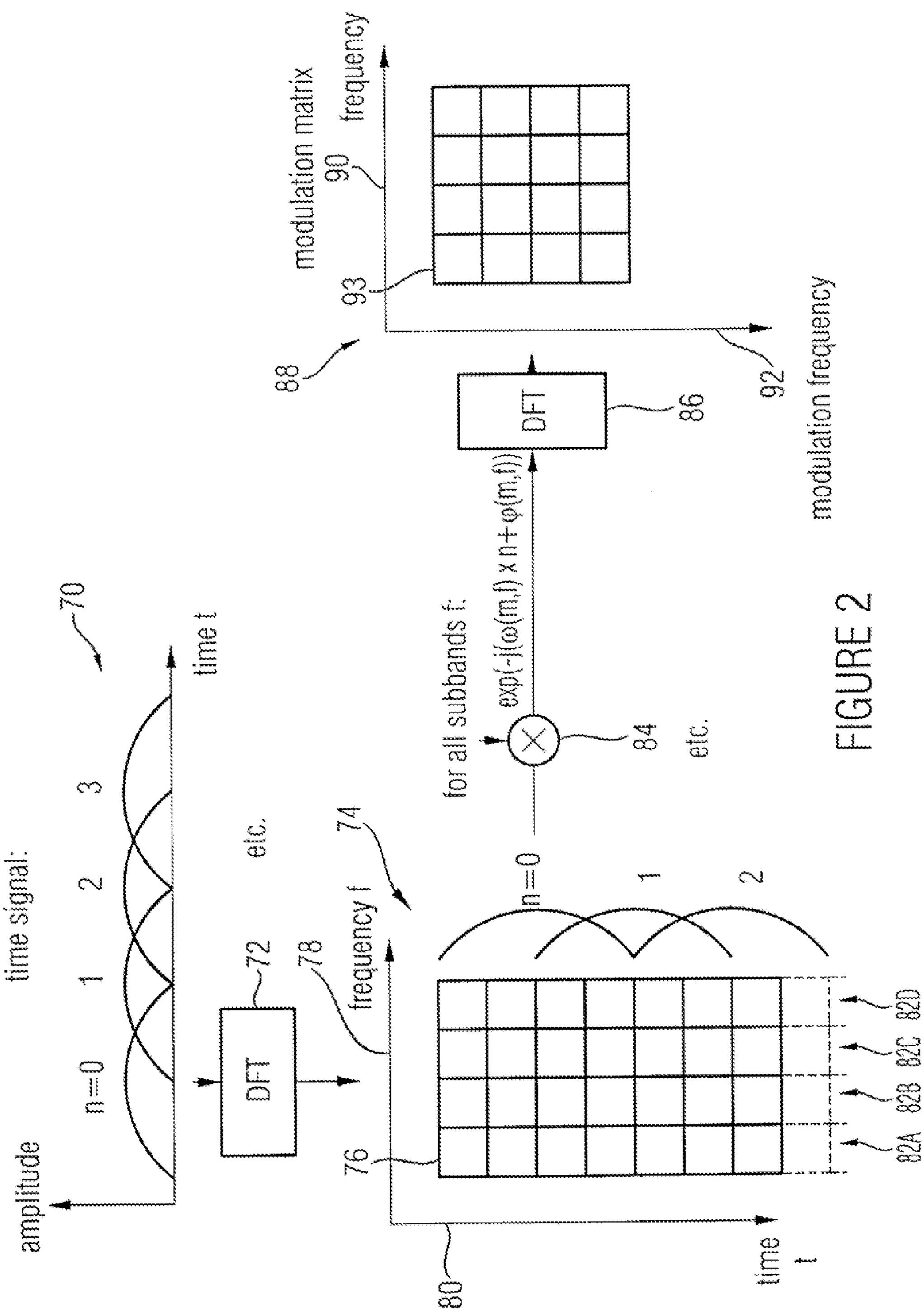
FIG. 2 shows a schematic for illustrating the operation of the device of FIG. 1.

The structure of the device 10 and the operation of the individual components having been described above, the following will discuss their operation in more detail with respect to FIGS. 1 and 2.

The processing of the information signal by the device 10 starts with the reception of the audio signal 14 at the input 12. The information signal 14 is present in a sampled form. The sampling has been done, for example, by means of an analog/digital converter. The sampling has been done with a certain sampling frequency $\omega_s$. The information signal 14 consequently reaches the input 12 as a sequence of sample and/or information values $s_i=s(2\pi/\omega_s \cdot i)$, wherein s is the analog information signal, $s_i$ are the information values, and the index i is an index for the information values. Among the incoming samples $s_i$, the windowing means 28 always combines 2N consecutive samples to form time blocks, in the present example with a 50% overlap. For example, it combines the samples $s_0$ to $s_{2N-1}$ to form a time block with the index n=0, the samples $s_N$ to $S_{3N-1}$ to form a second time block with the index n=1, the samples $s_{2N}$ to $s_{4N-1}$ to form a third time block of information values with the index n=2, etc. The windowing means 28 weights each of these blocks with a window and/or weighting function, as described above. Let $s''_0$ to $s''_{2N-1}$ be, for example, the 2N information values of the time block n, then the block output by the means 28 is finally yielded as $s''_0 \rightarrow s''_0 \cdot g_0$ to $s''_{2N-1} \rightarrow s^2_{2N-1} \cdot g_{2N-1}$, wherein $g_i$ with i=0 to 2N−1 is the weighting function.

FIG. 2 shows the windowing functions applied to the information values $s_i$ exemplarily for four consecutive time blocks n=0, 1, 2, 3 in a diagram 70, in which the time t is plotted along the x-axis in arbitrary units, and the amplitude of the windowing functions is plotted along the y-axis in arbitrary units. In this way, the windowing means 28 passes a new windowed time block of 2N information values each to the transform means 30 after always N information values. The repetition frequency of the time blocks is thus $\omega_s/N$.

The transform means 30 transforms the windowed time blocks to a spectral representation. The transform means 30 performs a spectral decomposition of the time blocks of windowed information values into a plurality of predetermined subbands and/or spectral components. The present case exemplarily assumes that the transform is a DFT and/or discrete Fourier transform. For each time block of 2N information values, the transform means 30 generates N complex-valued spectral values for N spectral components, if the information signal is real, in this exemplary case. The complex spectral values output by the transform means 30 represent the time/frequency representation 74 of the information signal. The complex spectral values are illustrated by boxes 76 in FIG. 2. As the transform means 30 generates at least one spectral value per consecutive time block of information values per subband and/or spectral component, the transform means 30 thus outputs a sequence of spectral values 76 per subband and/or spectral component at the frequency $\omega_s/N$. The spectral values output for a time block are illustrated horizontally located along the frequency axis 78 at 74 in FIG. 2. The spectral values output for a subsequent time block follow directly below in a vertical direction along the axis 80. The axes 78 and 80 thus represent the frequency and/or time axis of the time/frequency representation of the information signal 14. Exemplarily, FIG. 3 only shows four subbands. The sequence of spectral values per subband run along the columns in the exemplary representation of FIG. 2 and are illustrated by 82*a*, 82*b*, 82*c* and 82*d*.

Reference is briefly made to FIG. 1 again, where the information signal 14 is exemplarily illustrated as a function representable by $\sin(bt)\cdot(1+\mu\cdot\sin(at))$, wherein $\alpha$ is, for example, the modulation frequency of the envelope of the information signal 14 indicated by the dashed line 83, while $\beta$ represents the carrier frequency of the information signal 14, t is the time, and $\mu$ is the modulation depth. With a sufficiently high sampling frequency $\omega_s$, the result for this exemplary information signal by the transform 72 per time block is a block of spectral values 76, i.e. a row at 74, in which mainly the spectral component and/or the pertinent spectral value has a distinct maximum at the carrier frequency $\beta$. However, the spectral values for this spectral component $f=\beta$ vary in time for consecutive time blocks due to the variation of the envelope 83. Accordingly, the magnitude of the spectral values of the spectral component $\beta$ varies with the modulation frequency $\alpha$.

Up to here, the discussion has not taken into account that the various time blocks may each have a different phase offset with respect to the carrier frequency $\beta$ due to a frequency mismatch between the time block repeating frequency $\omega_s/N$ and the carrier frequency of the information sigma 14. Depending on the phase offset, the spectral values of the spectral blocks resulting from the time blocks in transform 72 are modulated with a carrier $e^{j\Delta\Phi f}$, wherein j represent the imaginary unit, f represents the frequency, and $\Delta\phi$ represents the phase offset of the respective time block. For an essentially equal carrier frequency, as is the case in the present exemplary case, the phase offset $\Delta\phi$ increases linearly. Therefore, the spectral values of a subband experience, due to a frequency mismatch between the time block repeating frequency and the carrier frequency, a modulation with a carrier component depending on the mismatch of the two frequencies.

Taking this into account, the carrier frequency determination means 32 now derives the carrier component in the subbands resulting by the phase offset of the time blocks and/or effected by the time block phase offset from the spectral values $a(\omega_s,n)$, wherein $\omega_b$ is the angular frequency $\omega$ and/or frequency f ($\omega=2\pi f$) of the respective subband $0\leqq b<N$ among all N subbands, and n is the time block and/or spectral block index associated with the time t according to $n=\omega_s\cdot t$. The thus determined modulation carrier frequency $\omega(m, f)$ is determined by the carrier frequency determination means 32 for each subband $\omega_b$ and/or each frequency f block-wise, wherein m indicates a block index, as will be explained in more detail below. For this purpose, the carrier frequency determination means 32 always combines M consecutive spectral values 76 of a subband $\omega_b$, such as the spectral values a ($\omega_b$, 0) to a ($\omega_b$, M−1). Among these M spectral values, it determines a phase behavior and/or course by phase unwrapping. Subsequently, it determines a linear equation that comes closest to the phase behavior, for example by means of a least error squares algorithm. From the slope and an axis portion and/or a phase or initial offset of the linear equation, the carrier frequency determination means 32 obtains the desired modulation carrier frequency $\omega_d$ for the subband b with respect to the time block m and/or a spectral value block phase offset $\phi$ for the subband b with respect to the time block m. This determination is performed by the carrier frequency determination means for all subbands via spectral values equal in time, i.e. for all spectral value blocks $a(\omega_{b,0})$ to a $(\omega_{b,M-1})$ with $\omega_b$ for all subbands $0\leqq b<N$. In this way, the carrier frequency determination means 32 determines a modulation carrier frequency $\omega_d$ and the spectral value block phase offset $\phi$ for each subband $\omega_b$, block after block. The division into blocks, on which the determination of the complex carriers for all subbands by the means 32 is based, is that also used by the windowing means for windowing. The carrier frequency determination means 32 outputs the determined values for the complex carrier to the demodulation means and/or the mixer 34.

The mixer 34 now mixes the windowed blocks of spectral values of the individual subbands, as they are output by the windowing means 36, with the complex conjugate of the respective modulation carrier frequencies $\omega_d$ considering the spectral value block phase offsets $\phi$ by multiplication of these subband spectral value blocks by $e^{-j\cdot(\omega\_d\cdot n+\phi)}$, wherein, as mentioned above, a different pair of $\omega_d$ and $\phi$ is always used for each subband and within each subband for the consecutive blocks. In this way, the mixer 34 outputs demodulated subband spectral value blocks aligned to each other, i.e. two-dimensional blocks of N spectral value blocks of M demodulated spectral values each.

As the modulations in the subbands caused by the time block offsets have been removed by the demodulation by means of the mixer 34, the phase behavior of the spectral values in the subbands within the blocks is flatter on the average and essentially runs around the phase 0. What is achieved in this way is that, in the subsequent transform by the transform means 38, the demodulated and windowed blocks of spectral values result in a spectral decomposition in which the frequency 0 and/or the constant component is very well centered.

The transform 86 by the transform means 38 following the demodulation 84 by the mixer 34 is performed block-wise on each subband and/or each sequence of demodulated blocks of spectral values. The transform 86 particularly subjects the demodulated spectral value blocks of the N subbands block-wise to a spectral decomposition. The result of the spectral decomposition of the blocks of spectral values may also be referred to as modulation frequency representation. For N blocks of windowed and demodulated spectral values aligned to each other, the transform 86 thus results in a matrix of M×N modulation values representing the frequency/modulation frequency representation of the information signal 14 over the time period of the M time blocks that contributed to this matrix. The modulation matrix is exemplarily shown at 88 in FIG. 2 for the case N=M=4. As can be seen, the frequency/modulation frequency representation 88 has two dimensions, namely the frequency 90 and the modulation frequency 92. The individual modulation values are illustrated with boxes 93 at 88.

The transform means 38 passes the modulation matrix to the processing means 40. According to the present embodiment, the processing means 40 is provided to filter the modulation component out of the information signal 14. In the present exemplary case, the processing means 40 therefore performs low-pass filtering on the modulation frequency components in the frequency/modulation frequency matrix. For purposes of illustration, FIG. 1 shows a diagram at 94 in which the modulation frequency is plotted along the x-axis and the magnitude of the modulation values is plotted along the y-axis. The diagram 94 represents a section of the modulation matrix 88 for the exemplary case of the information signal 14 of FIG. 1, i.e. the sine-modulated sine. In particular, the diagram 94 illustrates the course of the magnitudes of the modulation values along the modulation frequency for the subband with the frequency $\beta$, i.e. the carrier frequency. By the demodulation 84 by means of the mixer 34, the modulation frequency spectrum is substantially perfectly centered—at least in the case of the FFT as the transform 86—and/or correctly aligned. In particular the modulation frequency spectrum at the carrier frequency $\beta$ has two side bands 96 and 98 located at the modulation frequency $\alpha$, i.e. the modulation frequency of the envelope 83 of the information signal 14. Furthermore, the modulation values of the modulation matrix 88 have a constant component 100 at frequency $\beta$. The signal processing means 40 is now designed as a low-pass filter with a filter characteristic 102 illustrated with a dashed line to remove the two side bands 96 and 98 from the frequency/modulation frequency representation 88. In this way, the information signal 14 is freed of its modulation component, whereupon only the carrier component remains. The thus changed modulation matrix is passed to the inverse transform means 42 by the processing means 40. The inverse transform means 42 processes the modified modulation matrix for each subband such that the block of modulation values for the respective subband, i.e. a column in the modulation matrix 88, is subjected to a transform inverse to the transform of the transform means 38, so that these modulation value blocks are converted from the frequency/modulation frequency representation back to the time/frequency representation. In this way, the inverse transform means 42 generates, from each such block of modulation values for each subband, a block of spectral values for this subband.

From the output of the spectral values by the transform means 30, the above description mainly referred to the processing of the first M spectral values and/or of M consecutive spectral values for each subband. The processings by the means 32, 34, 36, 38, 40 and 42, however, are also repeated for following blocks of M spectral values each for each of the N subbands, namely with an overlap of the blocks of M spectral values each of exemplarily 50% in the present case, i.e. with an overlap per subband by M/2 spectral values. In FIG. 2, the blocks are exemplarily illustrated m=0, m+1 and m=2 in the time/frequency representation 74 by exemplary arch-shaped windowing and/or weighting functions exemplarily extending over M=4 spectral values in each subband. For each of these blocks m, the transform means 38 finally generates a modulation matrix of M×N modulation values each, which are filtered and/or weighted by the signal processing means 40 in the manner described above. The inverse transform means 42, in turn, generates a block of spectral values for each subband from these modified modulation matrices 88, i.e. a matrix of modified, but still demodulated blocks of spectral values.

However, the blocks of spectral values per subband output by the inverse transform means 42 differ from those obtained from the information signal 14 at the output of the windowing means 36 not only by the processing by the processing means 40, but also by the change effected by the demodulation. Therefore, the spectral value blocks are again modulated, in the modulation means 46, with the modulation carrier component with which they were previously demodulated. In particular, the corresponding blocks of spectral values previously multiplied by a $e^{-j\cdot(\omega\_d\cdot n+\phi))}$ are thus now multiplied by $e^{+j\cdot(\omega\_d\cdot n+\phi))}$, wherein n indicates the index of the spectral value sequence of the respective subband and ω_d and/or $\omega_d$ is the angular frequency of the complex modulation carrier determined by the means 32 for the respective spectral value block.

The sequences of blocks of spectral values per subband resulting after the modulation stage 46 are now combined for each subband by the combination means 44 to form a uniform stream 82_a_-82_d_ of spectral values per subband by overlapping the blocks of spectral values correspondingly with each other, in the present example by 50%, and combining mutually corresponding spectral values depending on the weighting function used in the windowing means 36, i.e. by adding in the case of the sine or KBD windows exemplarily given above.

The streams of spectral values per subband resulting at the output of the combination means 44 represent the time/frequency representation of the processed information signal 18. The streams are received by the inverse transform means 48. In each time step n, it uses the spectral values for all subbands $\omega_b$, i.e. all spectral values $a(\omega_b, n)$ with $0 \leqq b < N$, to perform a transform from the frequency representation to the time representation thereon, to obtain a time block for each n, i.e. with a repetition time duration of $2\pi N/\omega_s$. These time blocks are combined by the combination means 50 by an overlap of 50% in the present example and combining mutually corresponding information values in these time blocks to form a uniform stream of information values finally representing the processed information signal in the time domain 18 output at output 16.

The processed information signal is illustrated at 18 in a diagram in FIG. 1, in which the x-axis is the time and the y-axis is the amplitude of the information signal 18. As can be seen, the only thing remaining is the carrier component of the information signal 14 on the input side. The modulation components and/or the envelope component 83 has been removed.

Another words, the embodiment of FIGS. 1 and 2 represented a processing device that used a signal-adaptive filter bank for performing a decomposition of signals into carrier and modulation components, and used the resulting representation of the modulated signals to filter them. Likewise, however, it would be possible to perform coding, encryption or compression instead of the filter processing in the signal processing means, or to otherwise modify the modulation matrices. Compared to the modulation transform methods used for audio coding described in the introduction of the specification, which perform magnitude formation, this embodiment performs a demodulation with respect to a carrier component per subband. After an estimation of this subband carrier component in the carrier frequency determination means 32, the demodulation per subband is achieved by multiplication by the complex conjugate of this component. The thus demodulated subband signals are subsequently transformed into the modulation domain by a further frequency decomposition by means of the window means 36 and the transform means 38.

In the embodiment of FIG. 1, a DFT with 50% overlap and windowing was exemplarily used as the first transform 72, wherein, however, deviations and variations are conceivable. Several blocks of the first transform 72 were again combined by the windowing means 36—there with an exemplary 50% overlap—and demodulated subband-wise with a complex modulator, determined by the carrier frequency determination means 32, by means of the mixer 34 and subsequently transformed with a DFT. In the previous embodiment, the frequency of this modulator was derived from the phases of the corresponding blocks of the subband to be demodulated in the carrier frequency determination means, i.e. by approximate settling of a straight line through the unwrapped phase course of the spectral values of the corresponding blocks. However, this may also be done in another way. The carrier frequency determination means 32 may, for example per spectral block portion n to n+M−1, approximately set a plane into the phase component of all subbands in this portion. Furthermore, it would be possible that the carrier frequency determination means 32 does not perform the determination of the complex modulator block-wise, but continuously over the stream of spectral values per subband. For this purpose, the carrier frequency determination means 32 could, for example, first unwrap the phases of the sequence of spectral values of a respective subband, for example, low-pass filter them and then use the local increase of the filtered phase course for the adaptation of the complex modulator. Correspondingly, the modulation portion at the mixer 46 would also be changed. Generally, the carrier frequency determination means attempts to influence the phase behavior by either increasing or reducing the phase of the complex spectral values of a subband with a magnitude increasing or decreasing over the sequence such that a mean slope of the phase of the sequence of spectral values is reduced and/or the unwrapped phase course varies essentially around a fixed phase value, preferably the phase 0.

Once again, attention is explicitly drawn to the fact that other types than the DFT and/or IDFT are also conceivable for the used transforms 72, 86 and the transform means 42 and 48 inverse thereto. For example, the complex demodulated subband signal may also be transformed and/or spectrally decomposed into the frequency/modulation frequency representation with a real-valued transform separated according to real and imaginary part, respectively. The real part would then represent the amplitude modulation of the subband signal with respect to the carrier used for demodulation after the demodulation stage. The imaginary part would then represent the frequency modulation of this carrier. In the case of the DFT and/or IDFT for the means 38 and/or 42, the amplitude modulation component of the subband signal is reflected in the symmetric component of the DFT spectrum along the modulation frequency axis, while the frequency modulation component of the carrier corresponds to the asymmetric component of the DFT spectrum along the modulation frequency axis.

The embodiment described above has exemplarily been illustrated with respect to a simple sine-modulated sine signal. The embodiment of FIGS. 1 and 2, however, is also suitable for filtering the course of the envelope of a mixture of amplitude-modulated signals of any frequency, such as amplitude-modulated tonal signals. The individual frequency components of the envelope are directly represented for consistent processing in the modulation matrix 88, in contrast to the already known magnitude-phase representation according to the modulation transform analysis methods for audio coding described in the introduction of the specification. The filtering of frequency-modulated signals of little modulation depth, i.e. with a frequency swing significantly smaller than the subband width of the first DFT, is also possible with the embodiment of FIGS. 1 and 2.

The embodiment of FIGS. 1 and 2 thus concerned an arrangement for modulation filtering which, once again expressed in other words, was based on a signal-adaptive transform, filtering in the modulation domain and a corresponding back-transform. Without signal manipulation in the modulation domain, in the present embodiment of filtering, the arrangement of FIG. 1 is perfectly reconstructing. By introducing a suitable spectral range filter, such as filter 102, i.e. an attenuation of the modulation values with increasing distance from a center modulation frequency of zero, the modulation components to be removed may be attenuated as desired. However, other types of processing of information signals in the frequency/modulation frequency representation are also conceivable. Thus, it may also be desirable to remove only the carrier. In this case, the filtering would consist in a high-pass filtering, i.e. weighting with a weighting function with a modulation frequency edge at a certain modulation frequency which attenuates modulation values at lower modulation frequencies more than those at modulation frequencies above that. In yet other fields of application and/or applications, the signal processing in the signal processing means 40 could consist in band-pass filtering, i.e. weighting with a weighting function dropping from a certain center modulation frequency to separate components of the information signal originating from different sources, i.e. to achieve source separation. Further applications in which the above embodiment may be used may concern audio coding for coding audio signals, the reconstruction of disturbed signals and error concealing. Generally, however, the device 10 could also be used as a music effect appliance to realize special acoustic effects in the incoming audio signal. The processings in the signal processing means 40 may accordingly assume the most various forms, such as the quantization of the modulation values, setting some modulation values to zero, weighting individual portions of the or all modulation values or the like. A further field of application would be the use of device 10 of FIG. 1 as a watermark embedder. The watermark embedder would receive an audio signal 14, wherein the processing means 40 could introduce a received watermark into the audio signal by modifying individual segments and/or modulation values according to the watermark. The selection of the segments and/or modulation values could be done differently and/or varying in time for consecutive modulation matrices and would be made such that the modifications by the watermark introduction are inaudible for the human ear in the resulting watermarked audio signal 18 by psychoacoustic concealing effects.

Regarding the transform means, it is to be noted that they may, of course, also be designed as filter banks generating a spectral representation by many individual band-pass filterings. Furthermore, it is to be noted that the resulting information signal 18 after processing does not have to be output in the time domain representation. It would further be conceivable to output the information signal, for example, in a time/spectral representation or even in the spectral/modulation spectral representation. In the latter case, it would then, of course, be necessary to ensure that, on the receiver side, the necessary modulation 46 may again be performed with the suitable carrier, for example by also supplying the complex carriers varying per subband and spectral value block, which were used for the demodulation 84. In this way, the above embodiment could be used for realizing a compression method.

In particular, it is to be noted that, depending on the circumstances, the inventive scheme may also be implemented in software. The implementation may be done on a digital storage medium, particularly a floppy disk or a CD with control signals that may be read out electronically, which may cooperate with a programmable computer system so that the corresponding method is executed. In general, the invention thus also consists in a computer program product with a program code sorted on a machine-readable carrier for performing the inventive method when the computer program product runs on a computer. In other words, the invention may thus be realized as a computer program with a program code for performing the method when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for processing an information signal, comprising:

a unit for converting a time representation of the information signal to a time/spectral representation of the information sicinal, by block-wise transforming of the time representation of the information signal;

a unit for converting the time/spectral representation of the information signal to a spectral/modulation spectral representation by means of a single frequency decomposition transform, wherein the unit for converting the time/spectral representation is designed such that the spectral/modulation spectral representation depends on both a magnitude component and a phase component of the time/spectral representation of the information signal;

a unit for manipulating the spectral/modulation spectral representation of the information signal to obtain a modified spectral/modulation spectral representation; and a unit for forming a processed information signal representing a processed version of the information signal based on the modified spectral/modulation spectral representation.

2. The device according to claim 1, wherein the unit for converting the time representation is designed to decompose the time representation into a plurality of spectral components to obtain a sequence of complex spectral values per spectral component.

3. The device according to claim 2, wherein the unit for converting the time/spectral representation to the spectral/modulation spectral representation comprises a unit for block-wise spectral decomposition of the sequence of spectral values for a predetermined spectral component to obtain a portion of the spectral/modulation spectral representation.

4. The device according to claim 3, wherein the unit for block-wise spectral decomposition of the sequence of spectral values for a predetermined spectral component is designed to first multiply the sequence of spectral values block-wise by a complex carrier such that a magnitude of a mean slope of a phase course, of the sequence of spectral values is reduced block-wise to obtain demodulated blocks of spectral values, and to then spectrally decompose the demodulated blocks of spectral values block-wise to obtain the portion of the modified spectral/modulation spectral representation.

5. The device according to claim 4, wherein the unit for forming comprises:

a unit for back-converting the modified spectral/modulation spectral representation to a modified time/spectral representation to obtain modified demodulated blocks of spectral values for the predetermined spectral component;

a unit for block-wise multiplying the modified demodulated blocks of spectral values by a carrier complex conjugated with respect to the complex carrier to obtain modified blocks of spectral values; and a unit for combining the modified blocks of spectral values to form a modified sequence of spectral values to obtain a portion of a time/spectral representation of the processed information signal.

6. The device according to claim 5, wherein the unit for forming further comprises:

a unit for back-converting the processed information signal from the time/spectral representation to the time representation.

7. The device according to claim 4, wherein the unit for block-wise spectral decomposition of the sequence of complex spectral values for a predetermined spectral component comprises a unit for block-wise varying, depending on the time/spectral representation of the information signal, the complex carrier by which the sequence of complex spectral values is multiplied block-wise.

8. The device according to claim 7, wherein the unit for block-wise varying is designed to block-wise unwrap phases of the spectral values in the sequence of spectral values for block-wise varying of the complex carrier to obtain a phase course, to determine a mean slope of the phase course and to determine the complex carrier based on the mean slope.

9. The device according to claim 8, wherein the unit for block-wise varying is further designed to determine an axis portion of the phase course from the phase course and to further determine the complex carrier based on the axis portion.

10. The device according to claim 1, wherein the unit for manipulating is designed to perform weighting of the modulation components of the spectral/modulation spectral representation for modulation filtering, audio coding, source separation, reconstruction of the information signal, for error concealing or for superimposing a watermark on the information signal.

11. The device according to claim 1, wherein the information signal is an audio signal, a video signal, a multimedia signal, a measurement signal or the like.

12. The device according to claim 1, wherein the unit for converting the time representation to the time/spectral representation comprises:

a block formation unit for forming a sequence of blocks of information values from the time representation of the information signal; and a unit for spectrally decomposing each of the sequence of blocks of information values to obtain a sequence of spectral value blocks, wherein each spectral value block comprises a spectral value for each of a predetermined plurality of spectral components, so that the sequence of spectral value blocks per spectral component forms a sequence of spectral values.

13. The device according to claim 12, wherein the unit for converting the time/spectral representation to the spectral/modulation spectral representation comprises:

a unit for spectrally decomposing a predetermined sequence of the sequences of spectral values to obtain a block of modulation values, wherein the unit for manipulating is designed to modify the block of modulation values to obtain a modified block of modulation values, which is part of the modified spectral/modulation spectral representation.

14. The device according to claim 13, wherein the unit for spectrally decomposing each of the sequence of blocks of information values is designed such that it provides a sequence of complex spectral values in the spectral decomposition per spectral component, and the unit for spectrally decomposing the predetermined sequence of the sequences of spectral values is designed to first modify the predetermined sequence of spectral values such that a phase of the spectral values of the predetermined sequence of spectral values is increased or reduced by an amount steadily increasing or decreasing with the sequence to obtain a phase-modified sequence of spectral values, and then to spectrally decompose the phase-modified sequence of spectral values to obtain the at least one block of modulation values, and the unit for forming is designed to back-convert the modified block of modulation values from the spectral decomposition to obtain a modified sequence of spectral values, to modify the modified sequence of spectral values inversely to the unit for spectrally decomposing the predetermined sequence of the sequences of spectral values such that a phase of the spectral values of the at least one sequence of spectral values is increased or reduced by an amount steadily increasing or decreasing with the sequence to obtain a modified sequence of spectral values, to back-convert a sequence of modified spectral blocks based on the modified sequence of spectral values to obtain a sequence of modified blocks of information values, and to combine the modified blocks of information values to obtain the processed information signal.

15. The device according to claim 13, wherein the unit for forming is designed to back-convert the modified block of modulation values from the spectral decomposition to obtain a modified sequence of spectral values, and to back-convert a sequence of modified spectral blocks based on the modified sequence of spectral values to obtain a sequence of modified blocks of information values, and to combine the modified blocks of information values to obtain the processed information signal.

16. The device according to claim 15, wherein the unit for spectrally decomposing each of the sequence of blocks of information values is designed to first multiply each block of the sequence of blocks of information values by a window function and to then spectrally decompose it, and the unit for forming is designed to process the modified blocks of information values, when combining, such that the multiplication by the window function does not affect the processed information signal.

17. The device according to claim 1, wherein the single frequency decomposition transform is a single discrete Fourier transform.

18. A method for processing an information signal, comprising:

converting a time representation of the information signal to a time/spectral representation of the information signal by block-wise transforming of the time representation of the information signal;

converting the time/spectral representation to a spectral/modulation spectral representation by means of a single frequency decomposition transform, wherein the conversion of the time/spectral representation to the spectral/modulation spectral representation is performed such that the spectral/modulation spectral representation depends on both a magnitude component and a phase component of the time/spectral representation of the information signal;

modifying the spectral/modulation spectral representation of the information signal to obtain a modified spectral/modulation spectral representation; and forming a processed information signal representing a processed version of the information signal based on the modified spectral/modulation spectral representation.

19. A computer-readable medium having stored thereon a computer program with a program code for performing a method for processing an information signal, when the computer program runs on a computer, the method comprising converting a time representation of the information signal to a time/spectral representation by block-wise transforming of the time representation information signal; converting the information signal from the time/spectral representation to a spectral/modulation spectral representation by means of a single frequency decomposition transform, wherein the conversion of the time/spectral representation to the spectral/modulation spectral representation is performed such that the spectral/modulation spectral representation depends on both a magnitude component and a phase component of the time/spectral representation of the information signal; modifying the spectral/modulation spectral representation to obtain a modified spectral/modulation spectral representation; and forming a processed information signal representing a processed version of the information signal based on the modified spectral/modulation spectral representation.

* * * * *